United States Patent [19]

Nakamura et al.

[11] Patent Number: 5,068,150
[45] Date of Patent: Nov. 26, 1991

[54] COPPER POWDER FOR ELECTROCONDUCTIVE PAINTS AND ELECTROCONDUCTIVE PAINT COMPOSITIONS

[75] Inventors: Yoshinobu Nakamura; Kanetaro Sannohe; Yoshio Sohama; Toru Iwasaki; Sumiko Yamano, all of Takehara, Japan

[73] Assignee: Mitsui Kinzoku Kogyo Kabushiki Kaisha, Tokyo, Japan

[21] Appl. No.: 232,669

[22] Filed: Aug. 16, 1988

[30] Foreign Application Priority Data

Feb. 1, 1988 [JP] Japan .................................. 63-21630
Feb. 8, 1988 [JP] Japan .................................. 63-27235

[51] Int. Cl.$^5$ .......................... B32B 5/16; H01B 1/06
[52] U.S. Cl. .................................... 428/407; 428/403; 252/500; 252/512; 252/520
[58] Field of Search .............. 252/518, 500, 512, 520; 427/216, 220, 221; 428/403, 407; 75/638; 420/469

[56] References Cited

U.S. PATENT DOCUMENTS 4,680,140  7/1987  Kageyama .......................... 252/512
4,888,135  12/1989  Tsunaga et al. ...................... 428/407

Primary Examiner—Josephine Barr
Attorney, Agent, or Firm—Stevens, Davis, Miller & Mosher

[57] ABSTRACT

A copper powder for electroconductive paints comprising copper particles and an organic zirconate compound which has been applied as a coating on the surfaces of said particles and an electroconductive paint composition obtained from the copper powder for electroconductive paints. The organic zirconate compounds used in the present invention are an organic zirconate compound $(RO)_x-Zr-(OR')_{4-x}$ having an easily hydrolyzable organic group and an organic group which is hardly hydrolyzable and exhibits lipophilicity or a mixture of a zirconium acylate polymer and a higher carboxylic acid ester.

4 Claims, No Drawings

COPPER POWDER FOR ELECTROCONDUCTIVE PAINTS AND ELECTROCONDUCTIVE PAINT COMPOSITIONS

BACKGROUND OF THE INVENTION

The present invention relates to electromagnetic wave shielding materials, more particularly to a copper powder of which surface has been coated with an metal organic compound and to an electroconductive paint composition for shielding electromagnetic wave which contains the copper powder.

One of the electromagnetic wave shielding materials for the purpose of protecting electronic equipments from disturbance or jamming by electromagnetic waves is a electroconductive paint in which an electroconductive filler such as nickel powder, silver powder, copper powder or carbon powder is kneaded with any of various resin binders. Shielding against electromagnetic waves is accomplished by applying the paint on the surface of plastic molded articles by spraying or painting. Electroconductive paints of copper type are inexpensive in comparison with that of silver or nickel types and have excellent shielding effect.

However, in the electroconductive paints of copper type, a uniform dispersion state cannot be realized because the copper particles tend to agglomerate together in the paint. Moreover, the electroconductive paints of copper type tend to be easily oxidized by environmental factors such as heat and humidity, which leads to inferior storage stability and the deterioration of resistance to aging (attenuation of shielding effect). Many methods have hitherto been proposed for the purpose of solving these problems. The methods include the treatment of the particles of electrolytic copper powder with an organic carboxylic acid (Japanese Patent Laid-Open Application No. 258273/85), the surface treatment of copper powder with a coupling agent (Japanese Patent Laid-Open Application No. 30200/85), coating of the particles of electrolytic copper powder with silver (Japanese Patent Laid-Open Application No. 243277/85), coating of the particles of copper powder with an organic titanate (Japanese Patent Laid-Open Application Nos. 174661/84 and 36553/81), coating of the particles of copper powder with an organic aluminum (Japanese Patent Laid-Open Application No. 179671/84), metal plating of copper powder with solder (Japanese Patent Laid-Open Application No. 113505/82), coating of the particles of copper powder with copper oxide (Japanese Patent Laid-Open Application No. 35405/85) and the like. The copper powder coated with the above described surface coating agent has some advantageous effects.

However, the rust prevention of copper powder is not good, and the electroconductivity and environmental resistance of copper powder are insufficient. Moreover, conductive paints obtained with copper powder in the prior art, when used by the application thereof onto a matrix or base material, are inferior in adhesion to the matrix and do not always exhibit excellent storage and environmental resistance.

SUMMARY OF THE INVENTION

The present invention has been achieved in view of the above described background. An object of the present invention is to overcome the problems accompanying conventional copper powders for electroconductive paints and to provide a copper powder for electroconductive paints which has improved storage stability and environmental resistance of the copper powder itself and the paints as well as the effect of imparting good adhesion to the paint film without reduction of the electroconductivity of the copper powder and shielding effect with respect to electromagnetic waves. Another object is to provide an electroconductive paint composition.

We have conducted a variety of tests and researches on copper powders and electroconductive paints of copper type. As a result, it has been found that a copper powder containing an organic zirconate compound selected as a surface coating agent exhibits an excellent effect which cannot be obtained by using conventional coating agents. The present invention has been achieved on the basis of this discovery. We have further conducted researches based on the discovery and found that a surface treated copper powder exhibits excellent rust prevention and electroconductivity and that an electroconductive paint obtained therefrom has excellent electroconductivity and environmental resistance. The present invention has been thus achieved.

That is to say, the copper powder for electroconductive paints according to the present invention is characterized in that the surfaces of its particles are coated with an organic zirconate compound.

In the first embodiment of the present invention, the copper powder for electroconductive paints is characterized in that the surfaces of its particles are coated with the zirconate compound represented by the following general formula:

$$(RO)_x\text{-Zr-}(OR')_{4-x}$$

wherein: RO represents an easily hydrolyzable organic group, OR' represents an organic group which is hardly hydrolyzable but lipophilic, and x denotes an integer from 1 to 3.

In the second embodiment of the present invention, the copper powder for electroconductive paints is characterized in that the surfaces of its particles are coated with a mixture of a zirconium acylate polymer and a higher carboxylic acid ester.

In an embodiment according to the present invention, the electroconductive paint composition contains a copper powder coated with an organic zirconate compound, a resin binder and a solvent.

In another embodiment of electroconductive paint composition according to the present invention, the organic zirconate compound is added to the mixture of the copper powder, the resin binder and the solvent. In the present invention described above, the organic zirconate compound has around a zirconium atom an easily hydrolyzable and hydrophilic organic group and a hardly hydrolyzable and lipophilic organic group, so that on coating treatment of the surfaces of the particles of the copper powder, the hydrophilic organic group will cause a substitution reaction with water adsorbed on the surfaces of the particles of the copper powder to form a hydrophobic film of the organic zirconate compound in which the lipophilic organic group is arranged at the outside with respect to the surfaces of the particles of the copper powder. The copper powder thus treated has excellent rust prevention and excellent aging resistance under high temperature and high humidity conditions.

In the electroconductive paint composition according to the present invention, the copper powder according to the present invention is used, so that the storage stability of the composition can be greatly improved. Moreover, excellent heat resistance and environmental resistance can also be afforded to the paint film.

In the embodiment in which a mixture of a zirconium acylate polymer and a higher carboxylic acid ester, the surfaces of the particles of the copper powder are coated with the mixture of the zirconium acylate polymer and the higher carboxylic acid ester to modify the surfaces of the particles of the copper powder. Particularly, since the zirconium acylate polymer has an easily hydrolyzable alkoxy group and a hardly hydrolyzable and lipophilic acylate group, the easily hydrolyzable alkoxy group reacts with the adsorbed water on the surfaces of the particles of the copper powder or the film or binds the surfaces of the particle of the copper powder by electrostatic approach, while the lipophilic acylate group portion is oriented to the outside of the particles of the copper powder. The film of the lipophilic acylate group portion acts as a hydrophobic film on the surfaces of the particles of the copper powder, and the lipophilic acylate group portions will be entangled adroitly with resin binder molecules by bonding forces such as van der Waals force, hydrogen bond, ionic bond or covalent bond in an electroconductive composition to form a good dispersion state of the copper powder in the paint composition by shearing during stirring or kneading processes or the like.

The hydrophobic film of the zirconium acylate polymer covers the surfaces of the particles of the copper powder, but the coverage remains insufficient, so that gaps or crackings will be formed in the hydrophobic film. The higher carboxylic acid ester has an easily hydrolyzable alkoxy group, so that it will cause transesterification with the water adsorbed on the surfaces of the particles of the copper powder or bind to the surfaces of the particles of the copper powder and a hydrophobic film of the carboxylic acid ester will be formed in the gaps with the lipophilic acylate group portion, whereby a dense film is formed on the surfaces of the particles of the copper powder. Moreover, the lipophilic acylate group portion of the higher carboxylic acid ester, as well as the zirconium acylate polymer, will be entangled adroitly with resin binder molecules by bonding forces such as van der Waals force, hydrogen bond, ionic bond or covalent bond in the electroconductive composition to form a good dispersion state of the copper powder in the paint composition by shearing during stirring or kneading processes or the like.

Accordingly, in the embodiment that the mixture of a zirconium acylate polymer and a higher carboxylic acid ester is coated, it is possible to form a firm film of which electroconductivity will not be damaged by the reaction thereof with water adsorbed on the surfaces of the particles of copper powder or the paint film or by the electroconductive approach. Thus, the copper powder itself has excellent aging resistance, rust prevention, storage stability or the like since the mixture of a zirconium acylate polymer and a higher carboxylic acid ester is coated.

The electroconductive paint composition contains the copper powder according to the present invention, so that the electroconductivity, environmental resistance and storage stability of the paint is improved and the chemical and physical properties of the paint film is increased. At the same time, the bond strength with respect to the matrix is improved.

In the embodiment that a zirconium acylate polymer and a higher carboxylic acid ester are incorporated with a composition containing copper powder, a coating of the polymer and the ester is formed on the surfaces of the particles of the copper powder. Accordingly, the electroconductivity, environmental resistance and storage stability of the paint and the chemical and physical strength of the paint film are improved and the bond strength with respect to the matrix is also increased.

DETAILED DESCRIPTION OF THE INVENTION

Copper Powder

The copper powder used in the present invention is in a dendritic shape, particle or spherical shape, respectively obtained from electrolysis, reduction and atomization methods, or in a shape of flake which is obtained by mechanically crushing the powder.

The preferred copper powder used in the present invention has a specific surface area of 1.00 $m^2/g$ or less based on the BET method, a particle size distribution in which particles having a particle diameter of 50 $\mu m$ or more are present in a proportion less than 20% by weight based on the transmittance method and an average particle diameter of 30 $\mu m$ or less.

The copper powder in the particle or spherical shape can be processed into the shape of flakes by the use of a ball mill or the like to improve its shielding effect. It is also possible to obtain an excellent shielding effect by blending the dendritic copper powder and the copper powders of particle or spherical shape.

The copper powder as a raw material which may be used in the present invention may be coated preliminarily with metals such as silver, nickel, zinc, platinum, palladium, alloys such as solder, metal organic compounds such as organic silicon compounds, organic titanium compounds or organic aluminium compounds, surfactants, amino acids, carboxylic acids and derivatives thereof. The preferred coated copper powder as the raw material is the silver coated copper powder in which the whole or a part of the surfaces of the particles of the copper powder has been coated with silver. The amount of silver for coating is 0.1 to 20% by weight, preferably 1.0 to 10% by weight with respect to that of the copper component. This is because the resistance to oxidation of the copper powder is inferior with an amount of silver less than the lower limit, and the manufacturing cost will be increased if the amount exceeds the upper limit. If a copper powder coated with silver is used, a paint film having a shielding effect superior to that of a film with bare copper powder can be obtained. Thermosetting resins such as phenolic resins, epoxy resins or the like can also be applied as a resin binder. Examples of the method for coating the copper powder particles with silver are chemical substitution plating method, chemical vapor deposite (CVD) method and mechanical bonding method.

The copper powder may be previously coated with components used for the manufacturing of the electroconductive paint other than the materials described above.

It is also possible to remove the oxide layer on the surfaces of the particles of copper powder by the pretreatment with an agent such as an inorganic acid, an organic acid or a variety of reducing agents or with a reducing gas such as ammonia gas or hydrogen gas. After this pre-treatment, coating of the surfaces of the particles of copper powder with an organic zirconate compound can be conducted efficiently. Copper powder can be dried as a pre-treatment.

Organic Zirconate Compound

The surfaces of the particles of copper powder for electroconductive paints according to the present invention are coated with a special zirconium compound.

As the organic zirconate compounds which can be used in the present invention, there are organic zirconate compounds represented by the following formula:

$$(RO)_x\text{-}Zr\text{-}(OR')_{4-x}$$

wherein: RO represents an easily hydrolyzable organic group, OR' represents an organic group which is hardly hydrolyzable and exhibits lipophilicity, and x denotes an integer of 1 to 3; and zirconium acylate polymers.

The organic zirconate compounds represented by the above described formula are compounds having easily hydrolyzable organic groups and organic groups which are hardly hydrolyzable and exhibit lipophilicity.

Specific examples thereof are isopropyltriisostearoylzirconate, isopropyltridodecylbenzenesulfonylzirconate, isopropyltris(dioctylpyrophosphate)zirconate, tetraisopropylbis(dioctylphosphate)zirconate, tetraoctylbis(ditridecylphosphite)zirconate, tetra(2,2-diallyloxymethyl-1-butyl)bis(ditridecyl)phosphitezirconate, bis(dioctylpyrophosphate)oxyacetatezirconate, bis(diocytylpyrophosphate)ethylenezirconate, isopropyltrioctanoylzirconate, isopropyldimethacrylisostearoylzirconate, isopropylisostearoyldiacrylzirconate, isopropyltri(dioctylphosphate)zirconate, isopropyltricumylphenylzirconate, isopropyltri(N-aminoethylaminoethyl)zirconate, dicumylphenyloxyacetatezirconate, diisostearoylethylenezirconate, n-butyltriisostearoylzirconate, isobutyltriisostearoylzirconate, tert-butylisostearoylzirconate, isopropyltrioleylzirconate, isobutyltrioleylzirconate, isobutyl(diisostearoyl)oleylzirconate and the like.

In the present invention, the amount of the organic zirconate to be used is 0.01 to 15% by weight, preferably 0.05 to 10% by weight with respect to that of the copper powder. If the amount is less than the lower limit, the resistance to oxidation of the copper powder is inferior and generation of verdigris, discoloration, or agglomeration of the copper powder will be easily occurred. If the amount exceeds the upper limit, hydrophobic film is formed on the surfaces of the particles of the copper powder to prevent its electroconductivity.

Zirconium Acylate Polymer

One of the organic zirconate compounds to coat therewith the surfaces of the particles of copper powder is a zirconium acylate polymer.

The zirconium acylate polymer to be used in the present invention has the following repeating units I, II and/or III;

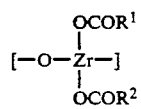

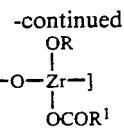

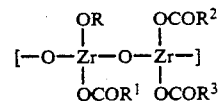

wherein: R, $R^1$, $R^2$ and $R^3$ are the same or different and represent respectively a hydrocarbon group having 1 to 25 carbon atoms, preferably R represents a hydrocarbon group having 1 to 10 carbon atoms, and $R^1$, $R^2$ and $R^3$ represent a hydrocarbon group having 8 to 24 carbon atoms, respectively.

The zirconium acylate polymer used in the present invention is, in addition to the above definition, also defined as follows and is in conformity with any one of these definitions.

That is to say, the zirconium acylate polymer is a polymer having easily hydrolyzable alkoxy groups which are linked with the zirconium atom of the main chain $(Zr\text{-}O)_n$ and hardly hydrolyzable but lipophilic acylate groups; or the zirconium acylate polymer is represented by the following general formulae A, B and/or C:

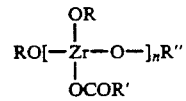

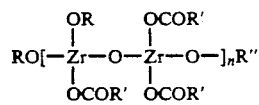

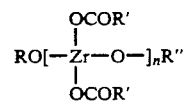

wherein: RO represents an easily hydrolyzable alkoxy group, OCOR' represents an acylate group which is hardly hydrolyzable and exhibits lipophilicity, R" represents a hydrogen atom, R or COR', and n denotes a numeral of 1 or more.

The zirconium acylate polymer can be obtained by reacting a tetraalkoxyzirconium $Zr(OR)_4$ with a carboxylic acid, an acid anhydride, an inorganic acid or the like, or by reacting a tetrachlorozirconium $Zr(Cl)_4$ with ammonia, a carboxylic acid, sodium carboxylate or the like.

One preferred method for synthesizing the zirconium acylate polymer is a method that a tetraalkoxyzirconium $Zr(OR)_4$ is reacted with a carboxylic acid, particularly a higher fatty acid in a proportion of several moles per mole of the zirconium compound. This method is preferred because of the following reasons. First, according to the method, generation of a monoacylate compound or a zirconium alkoxy polymer can be suppressed to obtain the zirconium acylate polymer quantitatively; secondly, by-products such as chlorides or inorganic acids are not produced; and thirdly, the side chain of the zirconium acylate polymer is acylated by the use of a higher fatty acid to make the zirconium acylate polymer more hydrophobic, and the reaction products thus obtained can be used as a reagent in the production of the copper powder of the present invention.

The method for synthesizing the zirconium acylate polymer by reacting a tetraalkoxyzirconium $Zr(OR)_4$ with a carboxylic acid or its isomer in a proportion of several moles per mole of the zirconium compound consists of reacting a tetraalkoxyzirconium such as tetrapropoxyzirconium, tetra-tert-butoxyzirconium, tetra-n-butoxyzirconium or tetraisobutoxyzirconium with higher saturated fatty acids such as stearic acid, palmitic acid, myristic acid, lauric acid and capric acid, and isomers thereof or higher unsaturated fatty acids such as oleic acid, linolic acid and linoleic acid and isomers thereof in a proportion more than 1 mole, preferably of 3 to 6 moles to 1 mole of the tetraalkoxyzirconium.

Separation and purification of the synthesized zirconium acylate polymer can be carried out with techniques such as distillation, extraction, recrystallization and the column chromatography.

Higher Carboxylic Acid Ester

The higher carboxylic acid esters used together with the zirconium acylate polymer in the present invention have long chain carbon atoms, and the preferred esters include the ones consisting of a higher fatty acid acylate group and an easily hydrolyzable alkoxy group.

The higher carboxylic acid esters which can be used in the present invention can be also defined as follows:

D wherein: $R^4CO$ represents an acylate group of a saturated or unsaturated fatty acid and $R^5O$ represents an easily hydrolyzable alkoxy group.

The part of the ester corresponding to the higher carboxylic acid is an acylate group of a higher fatty acid having 8 to 24 carbon atoms, and the part of the ester corresponding to the alcohol is an alkoxy group having 1 to 15 carbon atoms, preferably 1 to 10 carbon atoms.

Specific examples of such higher carboxylic acid esters are esters of higher saturated fatty acid such as stearic acid esters, palmitic acid esters, myristic acid esters, lauric acid esters and capric acid esters, and isomers thereof and esters of higher unsaturated fatty acid such as oleic acid esters, linolic acid esters and linoleic acid esters, and isomers thereof. If a lower carboxylic acid ester is used, the hydrophobicity of the carboxylic acid film formed on the surfaces of the particles of the copper powder will be impaired and a preferred dispersion state of copper powder cannot be achieved during the formation of a paint or film in combination with resin binders.

The higher carboxylic acid esters which can be used in the present invention can be generally obtained by reacting a higher carboxylic acid with an alcohol or from an ester as a by-product during the synthesis of the zirconium acylate polymer.

When the mixture of the zirconium acylate polymer and the higher carboxylic acid ester is obtained from the reaction mixture of a tetraalkoxyzirconium and a higher carboxylic acid, it is preferable to obtain the mixture of the tetraalkoxyzirconium and the higher carboxylic acid in a molar ratio of 1:2 to 8, particularly 1:3 to 6. If the proportion of the higher carboxylic acid is less than the above described range, a simple acylate such as a monoacylate and a zirconium alkoxy polymer are produced and a zirconium acylate polymer will not be produced. If the proportion of the higher carboxylic acid exceeds the above described range, the zirconium acylate polymer is obtained quantitatively, but by-products such as carboxylic acid ester or alcohols are also excessively produced. The alkoxy group of the tetraalkoxyzirconium used herein has 1 to 15 carbon atoms, preferably 1 to 10 carbon atoms. This is because if the alkoxy group has carbon atoms exceeding 10, hydrolysis thereof with water adsorbed on the surfaces of the particles of copper powder will not proceed rapidly. Moreover, the reactivity thereof with a carboxylic acid to form an acylate is decreased, and if the alkoxy group has carbon atoms, exceeding 15, the reactivity is greatly decreased and the reaction will scarcely proceed.

Separation and purification of the synthesized carboxylic acid ester can be carried out with techniques such as distillation, extraction, recrystallization and the column chromatography.

Process for Producing Copper Powder for Electroconductive Paint

As the processes for producing coated copper powder according to the present invention, there are mentioned the method of adding to copper powder (or a dispersion bath of copper powder and a dispersing medium) an organic zirconate compound having been dissolved in a solvent and removing afterwards the solvent or the method of adding to copper powder (or a dispersion bath of copper powder and a dispersing medium) an organic zirconate compound in a required amount and mixing with stirring them. If the dispersion bath of copper powder and a dispersing medium is used, the methods include the step wherein the dispersing medium is removed according to necessity to obtain copper powder for electroconductive paints.

In the dispersion bath of the copper powder in this process, the copper powder particles to be coated form a good dispersion state by means of a dispersing medium. The dispersing medium in this case is, for example, water or an organic solvent such as an alcohol. Preferred dispersing mediums are water, methyl alcohol, ethyl alcohol, toluene, hexane and the like. The amount of the dispersing medium is the one necessary for forming the preferred dispersion state of the copper powder and is preferably the minimal amount. If the amount of the dispersing medium increases, the reaction rate between the organic zirconate compound and the surfaces of the particles of copper powder is lowered, whereby it becomes difficult to obtain the desired copper powder.

The mixture of the zirconium acylate polymer and the higher carboxylic acid ester to be added can be obtained by mixing certain amounts of the two, and it can also be obtained from the reaction mixture of a tetraalkoxyzirconium and a higher carboxylic acid.

The mixing ratio of the zirconium acylate polymer and the higher carboxylic acid ester in this mixture is 5 to 95% by weight of the zirconium acylate polymer to 95 to 5% by weight of the higher carboxylic acid ester, preferably 10 to 90% by weight of the zirconium acylate polymer to 90 to 10% by weight of the higher carboxylic acid ester, more preferably 20 to 80% by weight of the zirconium acylate polymer to 80 to 20% by weight of the higher carboxylic acid ester. If the amount of the zirconium acylate polymer is less than the lower limit, hydrophobicity will be extremely inferior, and if the amount of the zirconium acylate polymer exceeds the upper limit, electroconductivity will be gradually decreased. Also, if the amount of the higher carboxylic acid ester is less than the lower limit, dispersibility of the copper powder during the formation of the paint and film will be extremely poor.

The organic zirconate compound can be diluted with, for example, an organic solvent. Organic solvents which can be used in this case are preferably non-polar solvents such as toluene and hexane and polar solvents such as alcohols and acetone.

The amount of the organic zirconate compound to be coated on copper powder is 0.05 to 15% by weight, preferably 0.1 to 10% by weight. If the amount is less than 0.05% by weight, the surface of the copper powder will be modified only insufficiently, and the electroconductivity and environmental resistance of the paint and the chemical and physical strength of the film will decrease with such a tendency being extensive in the range less than 0.01% by weight. On the other hand, if the amount exceeds 10% by weight, the film will be excessively formed on the surfaces of the particles of the copper powder, and the electroconductivity and environmental resistance of the paint and the chemical and physical strength of the film will decrease with such a tendency being extensive in the range exceeding 15% by weight.

The organic zirconate compound is added to the dispersion bath of the copper powder directly in small portions or after dilution thereof with an organic solvent or water. Operation parameters such as addition rate and agitation time after addition are desirably selected according to the surface state of the copper powder, that is, the amount of adsorbed water, specific surface area, shapes of the copper powder particles and the like.

After the film of the organic zirconate compound has been formed, the dispersing medium is removed according to necessity. This is because, if the drying is insufficient, good electroconductivity or shielding effect cannot be obtained because of the oxidation of the copper powder, and discoloration or verdigris may be generated.

Electroconductive Paint Composition

The electroconductive paint compositions in the first embodiment of the present invention contain copper powder particles of which surfaces have been coated with the organic zirconate compound according to the present invention, a resin binder and a solvent.

In another embodiment, the electroconductive paint composition of the present invention is a composition that the organic zirconate compound has been added to a mixture system of, for example, a resin binder and a solvent.

The resin binder which can be used in the present invention is the one which has good adhesion to plastics such as plurally used for ordinary electronic equipments. Resins such as acrylate type resins, polyurethane type resins, polyester type resins, styrene type resins, phenol type resins and epoxy type resins can be used with respect to housing plastics for electronic equipments such as ABS, polystyrene, PPO and polycarbonate.

The solvent which can be used in the present invention is a solvent for dissolving additives such as resin binders or the like, and is preferably the one or the mixture of two or more of organic solvents such as toluene, thinner, hexane, methyl ethyl ketone, xylene, methyl alcohol, ethyl alcohol, propyl alcohol, butyl alcohol, methyl isobutyl ketone, ethyl acetate, butyl acetate, methyl carbitol, ethyl carbitol, methyl cellosovle and ethyl cellosolve.

The copper powder is incorporated in the composition in a proportion of 35 to 95% by weight, preferably 40 to 90% by weight to the solid content of the electroconductive composition.

The cresin binder is incorporated in the composition in a proportion of 5 to 70% by weight, preferably 40 to 60% by weight to the solid content of the electroconductive composition.

A variety of additives other than the above described components can be contained according to objects. Such additives are reducing agents, surfactants, anti-setting agents, antifoaming agents, thickening agents, thixotropic agents, antirusting agents, fire retardants and the like.

The amount of the organic zirconate compound to be added to the copper powder is 0.05 to 15% by weight, preferably 0.1 to 10% by weight. If the amount is less than 0.05% by weight, the surface of the copper powder will be modified only insufficiently, and the electroconductivity and environmental resistance of the paint and the chemical and physical strength of the film will decrease with such a tendency being extensive in the range less than 0.01% by weight. On the other hand, if the amount exceeds 10% by weight, the organic zirconate compound is present in an excessive amount, whereby the modification of the surfaces of the particles of the copper powder will be prevented, and the electroconductivity and environmental resistance of the paint and the chemical and physical strength of the film will decrease with such a tendency being extensive in the range exceeding 15% by weight.

EXAMPLES

The present invention will now be described more fully with respect to the following examples, which are presented as illustrative only.

The present invention will be described separately on the use of a low molecular weight organic zirconate compound (A) and on the use of a zirconium acylate polymer as a polymer (B).

A. Low Molecular Weight Organic Zirconate CompoundsExperimental Example A-1

A dendritic copper powder (manufactured by MITSUI MINING & SMELTING CO., LTD., MF-D2) having an apparent density of 0.8 to 1.1 g/cm$^3$, a specific surface area of 0.4 m$^2$/g, a mean particle diameter of 8.0 μm, a purity of 99.2% or more, a content of insolubles in HNO$_3$ less than 0.03% and a reduced weight by reduction less than 0.80% was used. Oxidized layer was removed from the copper powder with an acidic solution, and the copper powder thus recovered was neutralized and dried. The copper powder thus treated was dispersed into toluene, and to the dispersion bath were added an organic zirconate compound specified in Table A-1 or a metal organic compound specified in Table A-2 to form a film on the surfaces of the particles of the copper powder and thus to obtain a coated copper powder.

TABLE A-1

Organic zirconate compound (within the scope of the present invention)

(1) Isopropyltriisostearoylzirconate
(2) Isopropyltridodecylbenzenesulfonylzirconate
(3) Isopropyltris(dioctylpyrophosphate)zirconate
(4) Tetraisopropylbis(dioctylphosphite)zirconate
(5) Tetraoctylbis(ditridecylphosphite)zirconate
(6) Tetra(2,2-diallyloxymethyl-1-butyl)bis(ditridecyl)phosphitezirconate
(7) Bis(dioctylpyrophosphate)oxyacetatezirconate
(8) Bis(dioctylpyrophosphate)ethylenezirconate
(9) Isopropyltrioctanoylzirconate
(10) Isopropyldimethacrylisostearoylzirconate
(11) Isopropylisostearoyldiacrylzirconate
(12) Isopropyltri(dioctylphosphate)zirconate
(13) Isopropyltricumylphenylzirconate
(14) Isopropyltri(N-aminoethyl-aminoethyl)zirconate
(15) Dicumylphenyloxyacetatezirconate
(16) Diisostearoylethylenezirconate
(17) n-butyltriisostearoylzirconate
(18) Isobutyltriisostearoylzirconate
(19) Tert-butylisostearoylzirconate
(20) Isopropyltrioleylzirconate
(21) Isobutyltrioleylzirconate
(2) Isobutyl(diisostearoyl)oleylzirconate

TABLE A-2

Organic metal compound (without the scope of the present invention)

(1) Isopropyltriisostearoyltitanate
(2) Isopropyltridodecylbenzenesulfonyltitanate
(3) Isopropyltris(dioctylpyrophosphate)titanate
(4) Tetraisopropylbis(dioctylphosphate)titanate
(5) Tetraoctylbis(didodecylphosphite)titanate
(6) Tetra(2,2-diallyloxymethyl-1-butyl)bis(ditridecyl)phosphitetitanate
(7) Bis(dioctylpyrophosphate)oxyacetatetitanate
(8) Bis(dioctylpyrophosphate)ethylenetitanate
(9) Isopropyltrioctanoyltitanate
(10) Isopropyldimethacrylisostearoyltitanate
(11) Isopropylisostearoyldiacryltitanate
(12) Isopropyltri(dioctylphosphate)titanate
(13) Isopropyltricumylphenyltitanate
(14) Isopropyltri(N-aminoethyl-aminoethyl)titanate
(15) Dicumylphenyloxyacetatetitanate
(16) Diisostearoylethylenetitanate
(17) Acetoalkoxyaluminium diisopropylate
(18) Vinyltriethoxysilane
(19) Vinyltris($\beta$-methoxyethoxy)silane
(20) $\gamma$-methacryloxypropyltrimethoxysilane
(21) $\gamma$-glycidoxypropyltrimethoxysilane
(22) $\beta$-(3,4-epoxycyclohexyl)ethyltrimethoxysilane
(23) N-$\beta$-(aminoethyl)-$\gamma$-aminopropyltrimethoxysilane
(24) N-$\beta$-(aminoethyl)-$\gamma$-aminopropylmethyldimethoxysilane
(25) $\gamma$-aminopropyltriethoxysilane
(26) N-phenyl-$\gamma$-aminopropyltrimethoxysilane
(27) $\gamma$-mercaptopropyltrimethoxysilane
(28) $\gamma$-chloropropyltrimethoxysilane After drying the copper powders, their discoloration and generation of verdigris were observed by standing for 2000 hours in the environments at a temperature of 85° C. and at a humidity of 60° C./95%RH.

The experiments were carried out with varying amounts of the coating agents specified in Tables A-1 and A-2 in 0.01, 0.05, 0.5, 1.0, 5.0, 10 and 10.5% by weight with respect to the weight of the copper powder.

As a result, when the copper powders were treated with the organic zirconium compounds specified in Table A-1 in amounts of 0.05 to 10.5% by weight, discoloration was not observed and verdigris was not generated. The copper powder which had been coated with the zirconate of the present invention in an amount of 0.01% by weight became a tint of dark brown with a generation of verdigris in a small portion.

On the other hand, in the copper powders which had been treated with the coating agents specified in Table A-2, remarkable discoloration to dark brown and the generation of verdigris were observed.

It can be seen from the results that the coated copper powders according to the present invention is excellent in aging resistance at high temperature and high humidity.

EXPERIMENTAL EXAMPLE A-2

The coated copper powders used in Experimental Example A-1 and a copper powder which had been obtained by holding for 2000 hours in the environments at a temperature of 85° C. and at a humidity of 60° C./95%RH was respectively agitated with 45% by weight of an acrylate type resin (solid content, 60% by weight) based on the weight of the copper powder and toluene as a solvent in a homomixer for 10 minutes to prepare electroconductive paints.

With the electroconductive paints thus obtained, circuits (films) were formed on acrylate resin plates with a screen printing apparatus and dried in an atmosphere at a temperature of 50° C. for 30 minutes. Volume resistivity of each circuit was measured.

As a result, the circuits obtained from the electroconductive paints according to the present invention had volume resistivity of $3.0 \times 10^{-4}$ to $6.0 \times 10^{-4}$ $\Omega$.cm. Also, the circuits obtained from the copper powder which had been left standing for 2000 hours had volume resistivity of $3.0 \times 10^{-4}$ to $6.0 \times 10^{-4}$ $\Omega$.cm at a temperature of 85° C. and $1.0 \times 10^{-4}$ to $6.0 \times 10^{-4}$ $\Omega$.cm at an environment of 60° C./95%RH.

On the other hand, the circuits obtained from the copper powders which had been treated with coating agents specified in Table A-2 had volume resistivities of $1.0 \times 10^{-3}$ to $3.0 \times 10^{-3}$ $\Omega$.cm, and the circuits obtained from the copper powder which had been left standing for 2000 hours had volume resistivity of $2.0 \times 10^{-2}$ to $5.0 \times 10^{-2}$ $\Omega$cm at a temperature of 85° C. and $3.0 \times 10^{-3}$ to $6.0 \times 10^{-3}$ $\Omega$.cm at an environment of 60° C./95%RH.

It can be seen from the results that the electroconductive paints of the present invention are excellent in initial electroconductivity and exhibit good electroconductivity after aging at high temperature and high humidity.

EXPERIMENTAL EXAMPLE A-3

The coated copper powders used in Experimental Example A-1 were respectively agitated with 45% by weight of an acrylate type resin (solid content, 60% by weight) based on the weight of the copper powder and toluene as a solvent in a homomixer for 10 minutes to prepare electroconductive paints.

The electroconductive paints thus obtained were left standing at a humidity environment of 25° C./70%RH for 90 days and then circuits were formed on acrylate resin plates with a screen printing apparatus and dried in an atmosphere at a temperature of 50° C. for 30 minutes. Volume resistivity of each circuit was measured.

As a result, the circuits obtained from the electroconductive paints according to the present invention had volume resistivities of $3.0 \times 10^{-4}$ to $6.0 \times 10^{-4}$ Ω.cm, and the variation of resistance after holding was almost zero.

On the other hand, the circuits obtained from the copper powders which had been treated with the coating agents specified in Table A-2 had volume resistivity of $1.8 \times 10^{-3}$ to $3.8 \times 10^{-3}$ Ω.cm, and the variation of resistance after holding was in the range of 27 to 80%.

It can be seen from the results that the electroconductive paints of the present invention is excellent in storage stability.

EXPERIMENTAL EXAMPLE A-4

The coated copper powders used in Experimental Example A-1 were respectively agitated with 45% by weight of an acrylate type resin (solid content, 60% by weight) based on the weight of the copper powder and toluene as a solvent in a homomixer for 10 minutes to prepare electroconductive paints.

From the electroconductive paints thus obtained, circuits were formed on acrylate resin plates with a screen printing apparatus and dried in an atmosphere at a temperature of 50° C. for 30 minutes. After the circuits had been left standing at a temperature of 85° C. and in an environment at 60° C./95%RH, volume resistivity of each circuit was measured.

As a result, the circuits obtained from the electroconductive paints according to the present invention exhibited a variation of 10 to 15% at a temperature of 85° C. and 0 to 5% in an environment at 60° C./95% RH.

On the other hand, the circuits obtained from the copper powders which had been treated with the coating agents specified in Table A-2 exhibited a variation of resistance of 80 to 120% at 85° C. and 40 to 60% in an environment at 60° C./95%RH.

It can be seen from the results that the coating films obtained from the electroconductive paints of the present invention are excellent in electroconductivity and exhibit good electroconductivity after aging at high temperature and high humidity.

B. Zirconium Acylate Polymer

Experimental material a. Zirconium acylate polymer (according to the present invention)

Higher carboxylic acids specified in Table B-1 were respectively mixed with 1 mole of tetraisopropoxyzirconium or tetra-n-butoxyzirconium in the following ratios to obtain the zirconium acylate polymers Nos. 1-1 to 1-8:

TABLE B-1

| Polymer | Higher carboxylic acid | Mole number |
| --- | --- | --- |
| 1-1 | Isostearic acid | 3 |
| 1-2 | Palmitic acid | 3 |
| 1-3 | Myristic acid | 4 |
| 1-4 | Lauric acid | 4 |
| 1-5 | Capric acid | 5 |
| 1-6 | Linolic acid | 5 |
| 1-7 | Oleic acid | 6 |
| 1-8 | Linoleic acid | 6 | b. Higher carboxylic acid (according to the present invention)

The higher carboxylic acid esters Nos. 2-1 to 2-8 specified in the following Table B-2 were used:

TABLE B-2

| Ester | Higher carboxylic acid ester |
| --- | --- |
| 2-1 | Isopropyl isostearate |
| 2-2 | n-butyl palmitate |
| 2-3 | Isobutyl myristate |
| 2-4 | Isopropyl laurate |
| 2-5 | t-butyl caprate |
| 2-6 | Isopropyl linolate |
| 2-7 | n-butyl oleate |
| 2-8 | t-butyl linolenate | c. Metal organic compound (comparative)

For the comparison, the metal organic compounds specified in Table B-3 were used:

TABLE B-3

| No. | Metal organic compound |
| --- | --- |
| 3-1 | Isopropyltridodecylbenzenesulfonyltitanate |
| 3-2 | Isopropyltris(dioctylpyrophosphate)titanate |
| 3-3 | Bis(dioctylpyrophosphate)oxyacetatetitanate |
| 3-4 | Tetraisopropylbis(dioctylphosphate)titanate |
| 3-5 | Isopropyltricumylphenyltitanate |
| 3-6 | Isopropyltri(dioctylphosphate)titanate |
| 3-7 | Bis(dioctylpyrophosphate)ethylenetitanate |
| 3-8 | γ-methacryloxypropyltrimethoxysilane |
| 3-9 | γ-glycidoxypropyltrimethoxysilane |
| 3-10 | γ-aminopropyltriethoxysilane |
| 3-11 | Acetoalkoxyaluminiumdiisopropylate |
| 3-12 | Isopropyltriisostearoyltitanate | d. Lower carboxylic acid

The lower carboxylic acids used for the comparison are shown in the following Table B-4:

TABLE B-4

| No. | Lower carboxylic acid |
| --- | --- |
| 4-1 | Isopropyl iso butyrate |
| 4-2 | Isopropyl valerate |
| 4-3 | n-butyl caproate |
| 4-4 | Ethyl acetate | e. Mixture of a zirconium acylate polymer and a higher carboxylic acid ester (according to the present invention)

The mixtures of the present invention were prepared by the use of the zirconium acylate polymers specified in Table B-1 and the higher carboxylic acid esters specified in Table B-2 in the combinations and compositions specified in Table B-5:

TABLE B-5

| No. | Zirconium acylate polymer | Higher carboxylic acid |
| --- | --- | --- |
| 5-1 | 1-1 50% by weight | 2-1 50% by weight |
| 5-2 | 1-2 50% by weight | 2-2 50% by weight |
| 5-3 | 1-3 50% by weight | 2-3 50% by weight |

TABLE B-5-continued

| No. | Zirconium acylate polymer | Higher carboxylic acid |
| --- | --- | --- |
| 5-4 | 1-4 50% by weight | 2-4 50% by weight |
| 5-5 | 1-5 50% by weight | 2-5 50% by weight |
| 5-6 | 1-6 50% by weight | 2-6 50% by weight |
| 5-7 | 1-7 50% by weight | 2-7 50% by weight |
| 5-8 | 1-8 50% by weight | 2-8 50% by weight |
| 5-9 | 1-1 70% by weight | 2-6 30% by weight |
| 5-10 | 1-2 70% by weight | 2-8 30% by weight |
| 5-11 | 1-3 70% by weight | 2-7 30% by weight |
| 5-12 | 1-4 70% by weight | 2-3 30% by weight |
| 5-13 | 1-5 70% by weight | 2-4 30% by weight |
| 5-14 | 1-6 70% by weight | 2-5 30% by weight |
| 5-15 | 1-7 70% by weight | 2-2 30% by weight |
| 5-16 | 1-8 70% by weight | 2-1 30% by weight |
| 5-17 | 1-1 30% by weight | 2-7 70% by weight |
| 5-18 | 1-2 30% by weight | 2-6 70% by weight |
| 5-19 | 1-3 30% by weight | 2-4 70% by weight |
| 5-20 | 1-4 30% by weight | 2-3 70% by weight |
| 5-21 | 1-5 30% by weight | 2-2 70% by weight |
| 5-22 | 1-6 30% by weight | 2-8 70% by weight |
| 5-23 | 1-7 30% by weight | 2-3 70% by weight |
| 5-24 | 1-8 30% by weight | 2-4 70% by weight | f. The mixture of a metal organic compound and a lower carboxylic acid ester for comparison The mixtures for comparison were prepared by the use of the metal organic compounds specified in Table B-3 and the carboxylic acid esters specified in Table B-4 in the combinations and compositions specified in Table B-6:

TABLE B-6

| No. | Metal Organic Compound | Carboxylic acid ester |
| --- | --- | --- |
| 6-1 | 3-1 50% by weight | 4-1 50% by weight |
| 6-2 | 3-2 50% by weight | 4-2 50% by weight |
| 6-3 | 3-3 50% by weight | 4-3 50% by weight |
| 6-4 | 3-4 50% by weight | 4-4 50% by weight |
| 6-5 | 3-5 50% by weight | 4-1 50% by weight |
| 6-6 | 3-6 50% by weight | 4-2 50% by weight |
| 6-7 | 3-7 50% by weight | 4-3 50% by weight |
| 6-8 | 3-8 50% by weight | 4-4 50% by weight |
| 6-9 | 3-9 50% by weight | 4-1 50% by weight |
| 6-10 | 3-10 50% by weight | 4-2 50% by weight |
| 6-11 | 3-11 50% by weight | 4-3 50% by weight |
| 6-12 | 3-12 50% by weight | 4-4 50% by weight | g. Copper powder

A dendritic electrolytic copper powder (manufactured by MITSUE MINING & SMELTING CO., LTD., MF-D2) specified in Table B-7 was used.

TABLE B-7

| Apparent density | 0.8–1.1 g/cm$^3$ |
| --- | --- |
| Specific surface area | 0.40 m$^2$/g |
| Purity | 99.2% or more |
| Insolubles in HNO$_3$ | less than 0.03% |
| Reduced weight by reduction | less than 0.80% |
| Mean particle diameter | 8.0 μm |

EXPERIMENTAL EXAMPLE B-1

Rust preventing effect

Copper powders shown in Table B-7 were respectively dispersed in toluene solvent by agitation, and were treated by adding the mixtures shown in Tables B-5 and B-6 (sample Nos. 5-1 to 5-24 and 6-1 to 6-12) in small portions to the copper powder dispersed solutions. After drying the copper powders, their heat resistance and humidity resistance were evaluated by holding them to stand for 2,000 hours at a temperature of 85° C. or in an environment of 60° C./95%RH. In these tests, the mixtures were used respectively in amounts of 0.01, 0.1, 0.5, 1.0, 5.0 and 10.0% by weight.

As a result, the copper powders according to the present invention which had been treated with the mixed sample Nos. 5-1 to 5-24 in amounts of 0.1 to 10% by weight exhibited no coloration, and verdigris was not generated.

On the other hand, the copper powders which had been treated with the comparative mixed sample Nos. 6-1 to 6-12 became dark brown, and verdigris was also generated. It has been found from the above described results that the copper powders according to the present invention has a dense hydrophobic film formed thereon and thus are excellent in rust preventing effect and environmental aging resistance.

EXPERIMENTAL EXAMPLE B-2

Volume resistivity and environmental aging resistance of the paints (a)

The surface coated copper powders used in Experimental Example B-1 were respectively agitated with 45% by weight of a methacrylate type resin (ACRYBOND-BC-415B, manufactured by MITSUBISHI RAYON CO., LTD.) based on the weight of the respective copper powder and with a solvent (toluene) to prepare electroconductive paints. Each of the obtained electroconductive paints was formed into a circuit on an acrylate plate by a screen printing apparatus, and dried in an atmosphere at 25° C. for 24 hours. Volume resistivity of each circuit was measured.

As a result, the electroconductive paints obtained from the copper powders according to the present invention which copper powders had been treated with the mixed sample Nos. 5-1 to 5-24, respectively, in the amounts of 0.1 to 10% by weight had volume resistivity of $3 \times 10^{-4}$ to $6 \times 10^{-4}$ Ω.cm. On the other hand, the electroconductive paints obtained from the copper powders which had been treated with the comparative mixed sample Nos. 6-1 to 6-12, respectively, had volume resistivities of $2 \times 10^{-3}$ to $5 \times 10^{-3}$ Ω.cm.

It has been found from the results that the copper powders according to the present invention will not impair electroconductivity.

After holding stand the above described electroconductive paints in an environment of 20 to 25° C./60 to 70%RH for 3 months, volume resistivity was measured.

As a result, the electroconductive paints obtained from the copper powders according to the present invention which copper powders had been treated with the mixed sample Nos. 5-1 to 5-24, respectively, in the amounts of 0.1 to 10% by weight had volume resistivity of $3 \times 10^{-4}$ to $6 \times 10^{-4}$ Ω.cm. On the other hand, the electroconductive paints obtained from the copper powders which had been treated with the comparative mixed sample Nos. 6-1 to 6-12, respectively, exhibited extensive separation of the copper powders from the resin or the solvent and thus paint making of the copper powders was impossible because of their solidification. It has been found from the results that the electroconductive paints obtained from the copper powders according to the present invention has excellent electroconductivity and environmental resistance.

EXPERIMENTAL EXAMPLE B-3

Volume resistivity and environmental aging resistance of the paints (b)

The uncoated copper powders shown in Table B-7, 45% by weight of a methacrylate type resin solution (ACRYBOND -BC-415B, manufactured by MITSUBISHI RAYON CO., LTD.) based on the weight of the respective copper powder, the mixed sample Nos. 5-1 to 5-24 and the comparative mixed sample Nos. 6-1 to 6-12, respectively, in amounts of 0.05, 0.1, 0.5, 1.0, 5.0 and 10.0% by weight based on the weight of the respective copper powders and the solid content of the resin and solvent (toluene) were agitated to prepare electroconductive paints. Each of the obtained electroconductive paints was formed into a circuit on an acrylate plate by a screen printing apparatus, and dried in an atmosphere at 25° C. for 24 hours. Volume resistivity of each circuit was measured.

As a result, the electroconductive paints according to the present invention to which the mixed sample Nos. 5-1 to 5-24, respectively, had been added had volume resistivity of $3\times10^{-4}$ to $6\times10^{-4}$ Ω.cm. On the other hand, the electroconductive paints to which the comparative mixed sample Nos. 6-1 to 6-12, respectively, had volume resistivities of $2\times10^{-3}$ to $5\times10^{-3}$ Ω.cm.

After holding the above described electroconductive paints in an environment of 20° to 25° C./60 to 70% RH for 3 months, volume resistivity was measured.

As a result, the electroconductive paints according to the present invention to which the mixed sample Nos. 5-1 to 5-24, respectively, had been added had volume resistivity of $3\times10^{-4}$ to $6\times10^{-4}$ Ω.cm. On the other hand, the electroconductive paints to which the comparative mixed sample Nos. 6-1 to 6-12, respectively, had been added exhibited extensive separation of the copper powders from the resin or the solvent and thus paint making of the copper powders was impossible because of their solidification.

It has been found from the results that the electroconductive paints obtained from the copper powders according to the present invention have excellent electroconductivity and environmental aging resistance.

EXPERIMENTAL EXAMPLE B-4

Heat aging resistance, humidity resistance and aging resistance of paint films

In the same manner as in Experimental Examples B-2 and B-3, electroconductive circuits were formed on acrylate plates, and the resistivity change(%) were evaluated after holding for 2,000 hours in the heat aging resistance test at 85° C., and in the humidity resistance test at 60° C./95%RH.

As a result, the paint films of the electroconductive paints obtained from the copper powders according to the present invention which copper powders had been treated with the mixed sample Nos. 5-1 to 5-24, respectively, in the amounts of 0.1 to 10% by weight and the paint films of the electroconductive paints according to the present invention to which the mixed sample Nos. 5-1 to 5-24 had been added exhibited in almost all cases a variation of about 8%, ranging from 5% to 15% in the heat aging resistance test at 85° C. Also, most of the samples exhibited a variation of about 5%, ranging from $-10\%$ to 8% in the humidity aging resistance test at 60° C./95%RH.

On the other hand, the paint films of the electroconductive paints obtained from the copper powders which had been treated with the comparative mixed sample Nos. 6-1 to 6-12 and the paint films of the electroconductive paints to which the comparative mixed sample Nos. 6-1 to 6-12 had been added exhibited in almost all cases variations ranging from 70 to 100% with not a few exhibiting the variation of 150% in the heating test at 85° C. Also, many of the samples exhibited a variation ranging from 50 to 70% in the humidity resistance test at 60° C./95%RH.

It can be seen from the results that the electroconductive paints according to the present invention and their films are excellent in heat resistance, humidity aging resistance.

EXPERIMENTAL EXAMPLE B-5

Salt solution spray test of the paint films

In the same manner as in Experimental Examples B-2 and B-3, electroconductive circuits were formed on acrylate plates, and subjected to the salt spray test. The salt spray test was conducted in accordance with the JIS specification using an aqueous salt solution which had a salt concentration of 5% by weight, and the generation of verdigris on the surface of the paint film was observed after 72 hours from its spraying.

As a result, in the paint films of the electroconductive paints obtained from the copper powders according to the present invention which copper powders had been treated with the mixed sample Nos. 5-1 to 5-24, respectively, in the amounts of 0.1 to 10% by weight and the paint films of the electroconductive paints according to the present invention to which the mixed sample Nos. 5-1 to 5-24 had been added, verdigris was not generated.

On the other hand, in the paint films of the electroconductive paints obtained from the copper powders which had been treated with the comparative mixed sample Nos. 6-1 to 6-12 and the paint films of the electroconductive paints to which the comparative mixed sample Nos. 6-1 to 6-12 had been added, verdigris was generated extensively on the whole surface of the paint films.

It has been found from the results that the electroconductive paints according to the present invention and their films are excellent in salt solution resistance.

EXPERIMENTAL EXAMPLE B-6

Adhesion of the paint films

Pad films in a size of $2\times2$ mm were formed on acrylate plates with the electroconductive paints which had been prepared in Experimental Examples B-2 and B-3 by the use of a screen printing apparatus. After drying the pad films, each of the pad films was subjected to a thermal shock test of 100 cycles under conditions of 75° C./60 minutes and $-55°$ C./60 minutes, and then subjected to a 90° pull test by affixing a 0.5 mm diameter tinned copper wire onto each paint film by using a cold setting epoxy resin. Each film had a thickness of $70\pm20$ μm, and the number of the pads tested was 20.

As a result, the pad films of the electroconductive paints obtained from the copper powders according to the present invention which copper powders had been treated with the mixed sample Nos. 5-1 to 5-24, respectively, in amounts of 0.1 to 10% by weight and the pad films of the electroconductive paints according to the present invention to which the mixed sample Nos. 5-1 to 5-24 had been added had pull strengths of 0.8 to 1.0 kg/mm$^2$.

On the other hand, the pad films of the electroconductive paints obtained from the copper powders which had been treated with the comparative mixed sample Nos. 6-1 to 6-12 and the pad films of the electroconductive paints to which the comparative mixed sample Nos. 6-1 to 6-12 had been added had low pull strengths of 0.4 to 0.6 kg/mm$^2$.

It has been found from the results that the paint films of the electroconductive paints according to the present invention has excellent adhesion to a matrix.

EXPERIMENTAL EXAMPLE B-7

Adhesion of the paint films

Pad films in a size of 2×2 mm were formed on phenolic plates, glass-epoxy plates and ABS plates with the electroconductive paints which had been prepared in Experimental Examples B-2 and B-3 by the use of a screen printing apparatus. After drying the pad films, each of the pad films was subjected to a 90° pull test by affixing a 0.5 mm diameter tinned copper wire onto each paint film by using a cold setting epoxy resin. Each film had a thickness of 70±20 μm, and the number of the pads tested was 20.

As a result, the pad films of the electroconductive paints obtained from the copper powders according to the present invention which copper powders had been treated with the mixed sample Nos. 5-1 to 5-24, respectively, in amounts of 0.1 to 10% by weight and the pad films of the electroconductive paints according to the present invention to which the mixed sample Nos. 5-1 to 5-24 had been added had pull strengths against the phenol plates, the glass-epoxy plates and the ABS plates of 0.8 to 1.2 kg/mm$^2$.

On the other hand, the pad films of the electroconductive paints obtained from the copper powders which had been treated with the comparative mixed sample Nos. 6-1 to 6-12 and the pad films of the electroconductive paints to which the comparative mixed sample Nos. 6-1 to 6-12 had been added had low pull strengths against the phenolic plates, the glass-epoxy plates and the ABS plates of 0.4 to 0.6 kg/mm$^2$.

It has been found from the results that the paint films of the electroconductive paints according to the present invention has excellent adhesion to a variety of matrixes.

EXPERIMENTAL EXAMPLE B-8

Observation of the section of the paint films

The pad films which had been formed in Experimental Examples B-6 and B-7 were observed with a scanning electron microscope (×700).

As a result, the section of each paint film of the electroconductive paints according to the present invention was uniform in the distribution of the copper powder, and the resin binder in the paint film and the matrix were firmly adhered.

On the other hand, in the section of each paint film of the comparative electroconductive paints the copper powder was distributed unevenly, and gaps were observed between the resin binder and the matrix.

EXPERIMENTAL EXAMPLE B-9

Electroconductivity (a)

Uncoated copper powders shown in Table B-7, 45% by weight of a phenolic resin (PL-2210; solid content, 60% by weight; manufactured by GUNEI KAGAKU KOGYO CO., LTD.) based on the weight of the copper powder, the mixed sample Nos. 5-1 to 5-24 and the comparative mixed sample Nos. 6-1 to 6-12 respectively in amounts of 0.05, 0.1, 0.5, 1.0, 5.0 and 10.0% by weight based on the weight of the copper powder and solid contents, and a solvent (methyl carbitol) were kneaded to prepare electroconductive paints. Circuits were formed on paper phenolic plate with the electroconductive paints obtained by using a screen printing apparatus and cured in an atmosphere at 150° C. for 30 minutes. Volume resistivity of the circuits was measured.

As a result, the electroconductive paints according to the present invention to which the mixed sample Nos. 5-1 to 5-24 had been added had volume resistivity of $3 \times 10^{-4}$ to $6 \times 10^{-4}$ Ω.cm. On the other hand, the electroconductive paints to which the comparative mixed sample Nos. 6-1 to 6-12 had been added had volume resistivities of $2 \times 10^{-3}$ to $5 \times 10^{-3}$ Ω.cm.

It has been found from the results that the electroconductive paints according to the present invention have excellent electroconductivity.

EXPERIMENTAL EXAMPLE B-10

Electroconductivity (b)

The copper powder which had been coated with 5% by weight of silver by a displacement plating method, 45% by weight of a methacrylate type resin solution (ACRYBOND-BC-415B, manufactured by MITSUBISHI RAYON CO., LTD.) based on the weight of the copper powder, the mixed sample Nos. 5-1 to 5-24 and the comparative mixed sample Nos. 6-1 to 6-12 respectively in amounts of 0.05, 0.1, 0.5, 1.0, 5.0 and 10.0% by weight based on the weight of the copper powder and solid contents, and a solvent (toluene) were agitated to prepare electroconductive paints. Circuits were formed on paper phenolic plate with the electroconductive paints obtained by using a screen printing apparatus and dried in an atmosphere at 25° C. for 24 hours. Volume resistivity of the circuits was measured.

As a result, the electroconductive paints according to the present invention to which the mixed sample Nos. 5-1 to 5-24 had been added had volume resistivity of $2 \times 10^{-4}$ to $4 \times 10^{-4}$ Ω.cm. On the other hand, the electroconductive paints to which the comparative mixed sample Nos. 6-1 to 6-12 had been added had volume resistivity of $2 \times 10^{-3}$ to $5 \times 10^{-3}$ Ω.cm.

It has been found from the results that the electroconductive paints according to the present invention have excellent electroconductivity.

EXPERIMENTAL EXAMPLE B-10

Heat resistance of the paint films

The coated copper powders used in Experimental Example B-1 was kneaded with 45% by weight of a phenolic resin (PL-2210; solid content, 60% by weight; GUNEI KAGAKU KOGYO CO., LTD.) based on the weight of the copper weight, and a solvent (methyl carbitol) to prepare electroconductive paints. Circuits were formed on paper phenolic plate with the electroconductive paints obtained by using a screen printing apparatus and cured in an atmosphere at 150° C. for 30 minutes. After dipping the circuits in a solder bath comprising Sn 63/Pb 37 for 5 seconds, the variations of resistance (%) of the circuits were measured.

As a result, the circuits obtained from the electroconductive paints (amounts used, 0.1 to 10% by weight) according to the present invention which had been treated with the mixed sample Nos. 5-1 to 5-24 caused no discoloration and showed in almost all cases the variations of resistance of ca. 5%, with ranging from −6% to 8%.

On the other hand, the circuits obtained from the electroconductive paints which had been treated with the comparative mixed sample Nos. 6-1 to 6-12 caused extensive discoloration and exhibited in many cases the variations of resistance of 50% or more with 150% or more in some cases.

It has been found from the results that the paint films of the electroconductive paints according to the present invention have excellent heat resistance.

What is claimed is:

1. A copper powder for electroconductive paints wherein the surfaces of the particles of copper powder are coated with a mixture of a zirconium acylate polymer and a higher carboxylic acid ester, said zirconium acylate polymer comprising at least one of the following repeating units I, II and III:

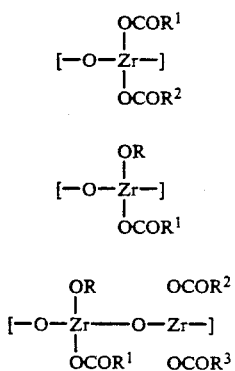

wherein R, $R^1$, $R^2$ and $R^3$ are the same or different and represent respectively a hydrocarbon group having 1 to 25 carbon atoms, said higher carboxylic acid ester having the following formula

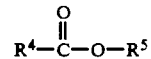

wherein $R^4CO$ represents an acylate group of a saturated or unsaturated fatty acid having 8 to 24 carbon atoms and $R^5O$ represents an easily hydrolyzable alkoxy group having 1 to 15 carbon atoms, the mixing ratio of the zirconium acylate polymer and the higher carboxylic acid ester being 10 to 90% by weight of said zirconium acylate polymer to 90 to 10% by weight of said higher carboxylic acid ester, and the amount of the mixture of the zirconium acylate polymer and the higher carboxylic acid ester to be applied on the surfaces of the particles of copper powder ranging from 0.05 to 10% by weight.

2. A copper powder for electroconductive paints according to claim 1 wherein said higher carboxylic acid ester comprises a higher fatty acid acylate group and an easily hydrolyzable alkoxy group.

3. The copper powder for electroconductive paints according to claim 1 wherein the higher carboxylic acid ester is selected from the group consisting of stearic acid esters, palmitic acid esters, myristic acid esters, lauric acid esters, capric acid esters, oleic acid esters, linolic acid esters and linoleic acid esters.

4. A copper powder for electroconductive paints according to claim 1 wherein the mixing ratio of the zirconium acylate polymer and the higher carboxylic acid ester is 20 to 80% by weight of said zirconium acylate polymer to 80 to 20% by weight of said higher carboxylic acid ester.

* * * * *